United States Patent
Lee et al.

(10) Patent No.: US 12,040,607 B2
(45) Date of Patent: *Jul. 16, 2024

(54) VOLTAGE STABILIZER AND POWER CONVERSION DEVICE USING SAME

(71) Applicant: Delta Electronics, Inc., Taoyuan (TW)

(72) Inventors: Kuan-Ting Lee, Taoyuan (TW); Chen-Chieh Kao, Taoyuan (TW); Yu-Liang Lin, Taoyuan (TW); Cheng-Chia Hsiao, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/212,816

(22) Filed: Jun. 22, 2023

(65) Prior Publication Data
US 2023/0335987 A1 Oct. 19, 2023

Related U.S. Application Data

(63) Continuation of application No. 17/726,147, filed on Apr. 21, 2022, now Pat. No. 11,735,909.

(30) Foreign Application Priority Data

Dec. 29, 2021 (CN) .......................... 202111634471.4

(51) Int. Cl.
| | |
|---|---|
| *H02H 9/04* | (2006.01) |
| *H02M 3/155* | (2006.01) |
| *H02M 3/158* | (2006.01) |
| *H03K 17/0812* | (2006.01) |
| *H03K 17/60* | (2006.01) |
| *H03K 17/687* | (2006.01) |

(52) U.S. Cl.
CPC .............. *H02H 9/04* (2013.01); *H02M 3/155* (2013.01); *H02M 3/158* (2013.01); *H03K 17/08122* (2013.01); *H03K 17/60* (2013.01); *H03K 17/687* (2013.01)

(58) Field of Classification Search
CPC .......... H02H 9/04; H02H 9/041; H02H 9/042; H02H 9/043; H02M 3/155; H02M 3/156; H03K 17/08122; H03K 17/08126; H03K 17/08128; H03K 17/60; H03K 17/687
USPC ......................................... 327/427, 432, 434
See application file for complete search history.

(56) References Cited

U.S. PATENT DOCUMENTS

| | | | | |
|---|---|---|---|---|
| 6,606,227 B2 * | 8/2003 | Rapsinski | ............. | H02J 7/0034 307/10.6 |
| 7,139,157 B2 * | 11/2006 | Taylor | .................... | H02H 3/202 361/84 |
| 10,693,292 B2 | 6/2020 | Tang et al. | | |

(Continued)

*Primary Examiner* — William Hernandez
(74) *Attorney, Agent, or Firm* — KIRTON McCONKIE; Evan R. Witt

(57) ABSTRACT

A voltage stabilizer is provided for stabilizing a gate-source voltage of a switching element, wherein a source of the switching element receives a first driving voltage. The voltage stabilizer includes a transistor and a first resistor. A base of the transistor receives a second driving voltage, a collector of the bipolar junction transistor is electrically connected to a gate of the switching element, a first terminal of the first resistor is electrically connected to the collector and the gate, a second terminal of the first resistor is electrically connected to the source of the switching element and receives the first driving voltage.

17 Claims, 5 Drawing Sheets

(56) References Cited

U.S. PATENT DOCUMENTS

| | | |
|---|---|---|
| 11,061,425 B2 | 7/2021 | Liu |
| 2012/0105027 A1* | 5/2012 | Dunipace .................. G05F 3/18 |
| | | 323/265 |
| 2021/0080990 A1* | 3/2021 | Liu ...................... H03K 17/145 |
| 2022/0069569 A1* | 3/2022 | Lin .......................... H02H 9/04 |

* cited by examiner

VOLTAGE STABILIZER AND POWER CONVERSION DEVICE USING SAME

CROSS-REFERENCE TO RELATED APPLICATION

This application is a Continuation Application of U.S. patent application Ser. No. 17/726,147 filed on Apr. 21, 2022 and entitled "VOLTAGE STABILIZER AND POWER CONVERSION DEVICE USING SAME", which claims priority to China Patent Application No. 202111634471.4, filed on Dec. 29, 2021. The entire contents of the above-mentioned patent application are incorporated herein by reference for all purposes.

FIELD OF THE INVENTION

The present disclosure relates to a voltage stabilizer, and more particularly to a voltage stabilizer capable of stabilizing a gate-source voltage of a p-type MOSFET. The present disclosure also relates to a power conversion device using the voltage stabilizer.

BACKGROUND OF THE INVENTION

Nowadays, most electronic equipments are equipped with a power conversion device to convert power. Taking the electronic equipment as a DC fan motor as an example, the application conditions of the DC fan motor are becoming more and more diversified, so that the voltage received by the DC fan motor requires wider operating range. However, due to the expansion of the voltage range, the electronic components of the power conversion device are easily damaged when an abnormal surge voltage occurs. Therefore, the design on the existing power conversion device must be optimized to meet the needs of different customer systems in the future.

Furthermore, the power conversion devices all include at least one bridge arm switch circuit so as to achieve the purpose of power conversion by the switching operation of switching elements of the bridge arm switch circuit. The two switching elements of the bridge arm switch circuit can be respectively composed of n-type MOSFETs or p-type MOSFETs. The power conversion devices further include a driving circuit to drive the bridge arm switch circuit to operate.

However, the driving circuits of the traditional power conversion devices are all designed with voltage dividers. Therefore, when the switching element of the bridge arm switch circuit is a p-type MOSFET and the driving circuit is electrically connected to the gate and the source of the p-type MOSFET, the driving circuit using the voltage divider cannot effectively resist the impact from the unexpected abnormal surge voltage. Once the abnormal surge voltage occurs and the voltage received by the driving circuit is high, it will easily cause the gate-source voltage of the p-type MOSFET to be unable to maintain a safe voltage range, so that the P-type MOSFET is easily damaged. On the contrary, in order to avoid the impact from the abnormal surge voltage, the driving circuit can receive lower voltage. However, it will cause the gate-source voltage value to be too low and is not within the lower conduction threshold of the p-type MOSFET so that the electronic equipment cannot operate normally, and does not meet the current trend of wide voltage range requirements.

For addressing the drawbacks of the conventional technologies, there is a need of providing a voltage stabilizer and a power conversion device using the same.

SUMMARY OF THE INVENTION

An object of the present disclosure provides a voltage stabilizer and a power conversion device using the same. The voltage stabilizer can stabilize a gate-source voltage of a p-type MOSFET, so as to protect the p-type MOSFET from being damaged due to an impact from an unexpected abnormal surge voltage, and also make the power conversion device to meet the current trend of wide voltage range requirements.

In accordance with an aspect of the present disclosure, a power conversion device is provided. The power conversion device includes a system power, a controller, a switch circuit and a voltage stabilizer. The system power is configured to output a first driving voltage. The controller is electrically connected to the system power and driven by the system power. The switch circuit includes a first switching element, a source of the first switching element is electrically connected to the system power for receiving the first driving voltage, and the switch circuit converts the first driving voltage into an output voltage. The voltage stabilizer is configured to stabilize a gate-source voltage of the first switching element and includes a bipolar junction transistor, a first resistor and a second resistor. A base of the bipolar junction transistor receives a second driving voltage, and a collector of the bipolar junction transistor is electrically connected to a gate of the first switching element. A first terminal of the first resistor is electrically connected to the collector and the gate, and a second terminal of the first resistor is electrically connected to the system power and the source of the first switching element and receives the first driving voltage. A first terminal of the second resistor is electrically connected to an emitter of the bipolar junction transistor, and a second terminal of the second resistor receives a third driving voltage. The bipolar junction transistor is operated in an active region.

In accordance with another aspect of the present disclosure, a voltage stabilizer is provided for stabilizing a gate-source voltage of a first switching element, wherein a source of the first switching element receives a first driving voltage. The voltage stabilizer includes a bipolar junction transistor, a first resistor and a second resistor. A base of the bipolar junction transistor receives a second driving voltage, and a collector of the bipolar junction transistor is electrically connected to a gate of the first switching element. A first terminal of the first resistor is electrically connected to the collector and the gate, and a second terminal of the first resistor is electrically connected to the source of the first switching element and receives the first driving voltage. A first terminal of the second resistor is electrically connected to an emitter of the bipolar junction transistor, and a second terminal of the second resistor receives a third driving voltage. The bipolar junction transistor is operated in an active region.

In accordance with another aspect of the present disclosure, a power conversion device is provided. The power conversion device includes a system power, a controller, a switch circuit and at least one voltage stabilizer. The system power is configured to output a first driving voltage. The controller is electrically connected to the system power and driven by the system power, and outputs a second driving voltage and a third driving voltage. The switch circuit includes at least one switch bridge arm, the at least one switch bridge arm includes a p-type MOSFET, and the switch circuit converts the first driving voltage into an output voltage. Each of the at least one voltage stabilizer is configured to stabilize a gate-source voltage of a corresponding p-type MOSFET and includes a bipolar junction transistor, a first resistor and a second resistor. A base of the bipolar junction transistor is electrically connected to the controller for receiving the second driving voltage, and a collector of the bipolar junction transistor is electrically connected to a gate of the corresponding p-type MOSFET. A first terminal of the first resistor is electrically connected to the collector and the gate of the corresponding p-type MOSFET, and a second terminal of the first resistor is electrically connected to the system power and the source of the corresponding p-type MOSFET and receives the first driving voltage. A first terminal of the second resistor is electrically connected to an emitter of the bipolar junction transistor, and a second terminal of the second resistor is electrically connected to the controller for receiving a third driving voltage. The bipolar junction transistor is operated in an active region.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
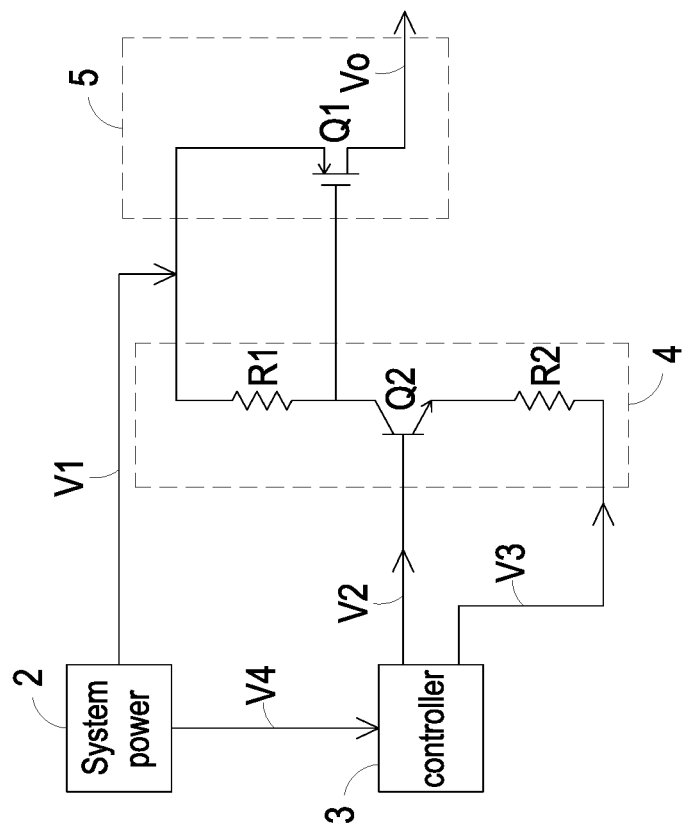
FIG. 1 is a schematic circuit diagram illustrating a power conversion device according to a first embodiment of the present disclosure.

Please refer to FIG. 1 which is a schematic circuit diagram illustrating a power conversion device according to a first embodiment of the present disclosure. In the embodiment, the power conversion device 1 is configured to convert a received input voltage (not shown) into an output voltage Vo, so as to drive an electronic equipment (not shown) to operate. Preferably but not exclusively, the electronic equipment is a DC motor.

The power conversion device 1 includes a system power 2, a controller 3, a voltage stabilizer 4 and a switch circuit 5. The system power 2 is configured to convert the input voltage (not shown) received by the power conversion device 1 into a first driving voltage V1. In other embodiments, the system power 2 further converts the input voltage received by the power conversion device 1 into a first control voltage V4.

The switch circuit 5 is electrically connected to the system power 2 for receiving the first driving circuit V1 and includes a first switch element Q1 which has a p-type MOSFET. A source of the first switching element Q1 is electrically connected to the system power for receiving the first driving voltage V1, and a drain of the first switching element Q1 is electrically connected to the electronic equipment. Through the switching operation of the first switching element Q1, the switch circuit 5 converts the first driving voltage V1 into the output voltage Vo and outputs the output voltage Vo at the drain for driving the electronic equipment to operate. In some embodiments, the switch circuit 5 further includes a second switching element (not shown), and the first switching element Q1 and the second switching element are electrically connected in series to form a switch bridge arm, so as to stabilize a turn-on voltage of the switch circuit 5. Preferably but not exclusively, the first switch element Q1 is an upper bridge arm of the switch bridge arm at one side of a full bridge circuit, and the second switching element is a lower bridge arm of the switch bridge arm. In some other embodiments, other than the first switching element Q1 and the second switching element, the switch circuit 5 further includes other switching element(s), so that the switch circuit 5 includes a full bridge switch circuit having two switch bridge arms or includes more than three switch circuits.

The voltage stabilizer 4 is configured to stabilize a gate-source voltage of the first switching element Q1 of the switch circuit 5 and includes a bipolar junction transistor Q2, a first resistor R1 and a second resistor R2. A first terminal of the first resistor R1 is electrically connected the gate of the first switching element Q1, and a second terminal of the first resistor R1 is electrically connected to the system power 2 and the source of the first switching element Q1 and receives the first driving voltage V1. A first terminal of the second resistor R2 is electrically connected to an emitter of the bipolar junction transistor Q2, and a second terminal of the second resistor R2 receives a third driving voltage V3.

A base of the bipolar junction transistor Q2 receives a second driving voltage V2, and a collector of the bipolar junction transistor Q2 is electrically connected to the gate of the first switching element Q1 and the first terminal of the first resistor R1. In some embodiments, as shown in FIG. 1, the bipolar junction transistor Q2 is a NPN bipolar junction transistor, but not limited thereto. Alternatively, the bipolar junction transistor Q2 is a PNP bipolar junction transistor.

The controller 3 includes, but not limited, a microcontroller unit. The controller 3 is electrically connected with the system power 2, the base of the bipolar junction transistor Q2 and the second terminal of the second resistor R2, and is driven by the first control voltage V4 outputted by the system power 2. Moreover, the second driving voltage V2 received by the base of the bipolar junction transistor Q2 and the third driving voltage V3 received by the second terminal of the second resistor R2 are respectively provided by the controller 3.

In the embodiment, the controller 3 further controls the bipolar junction transistor Q2 to operate in an active region (also referred to as an amplification region). Namely, the controller 3 outputs the second driving voltage V2 and the third driving voltage V3 to forward bias a base-emitter voltage and to reverse bias a base-collector voltage of the bipolar junction transistor Q2, so as to make the bipolar junction transistor Q2 to operate in the active region, thereby stabilizing an emitter current of the bipolar junction transistor Q2. Further, since the collector current of the bipolar junction transistor Q2 is approximately equal to the emitter current of the bipolar junction transistor Q2, the collector current of the bipolar junction transistor Q2 is also stable. Therefore, when the first driving voltage V1 outputted by the system power 2 (i.e., the source voltage of the first switching element Q1) rises due to, e.g., an unexpected abnormal surge voltage and accordingly the gate voltage of the first switch element Q1 rises, the gate-source voltage of the first switching element Q1 still remains stable because the emitter current of the bipolar junction transistor Q2 is stable. Consequently, the voltage stabilizer can protect the first switching element Q1 of the p-type MOSFET from being damaged due to the impact from the unexpected abnormal surge voltage, and also eliminate the need to reduce the input voltage received by the power conversion device 1 so as to meet the current trend of wide voltage range requirements.

Figure 2:
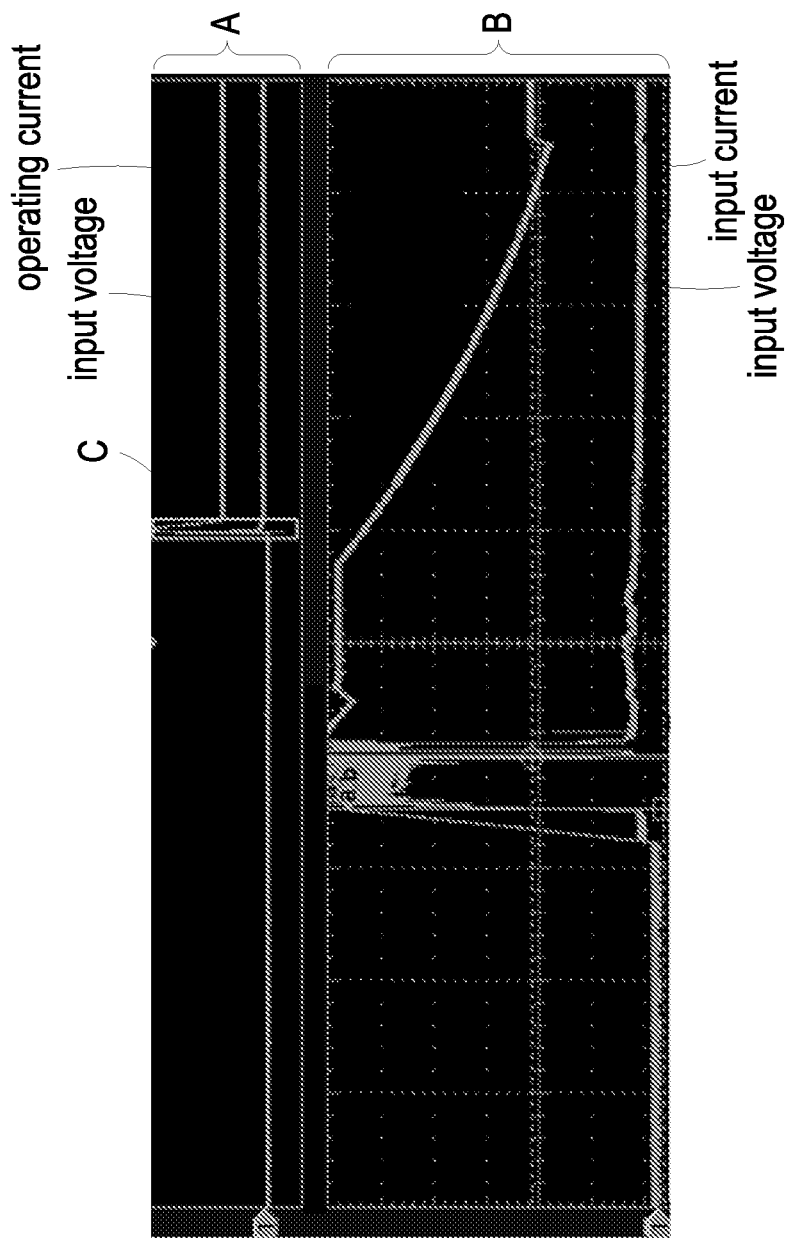
FIG. 2 is a simulation drawing illustrating the waveform of input voltage received by a traditional power conversion device, which does not employ the voltage stabilizer shown in FIG. 1, and an operating current of an electronic equipment.
Figure 3:
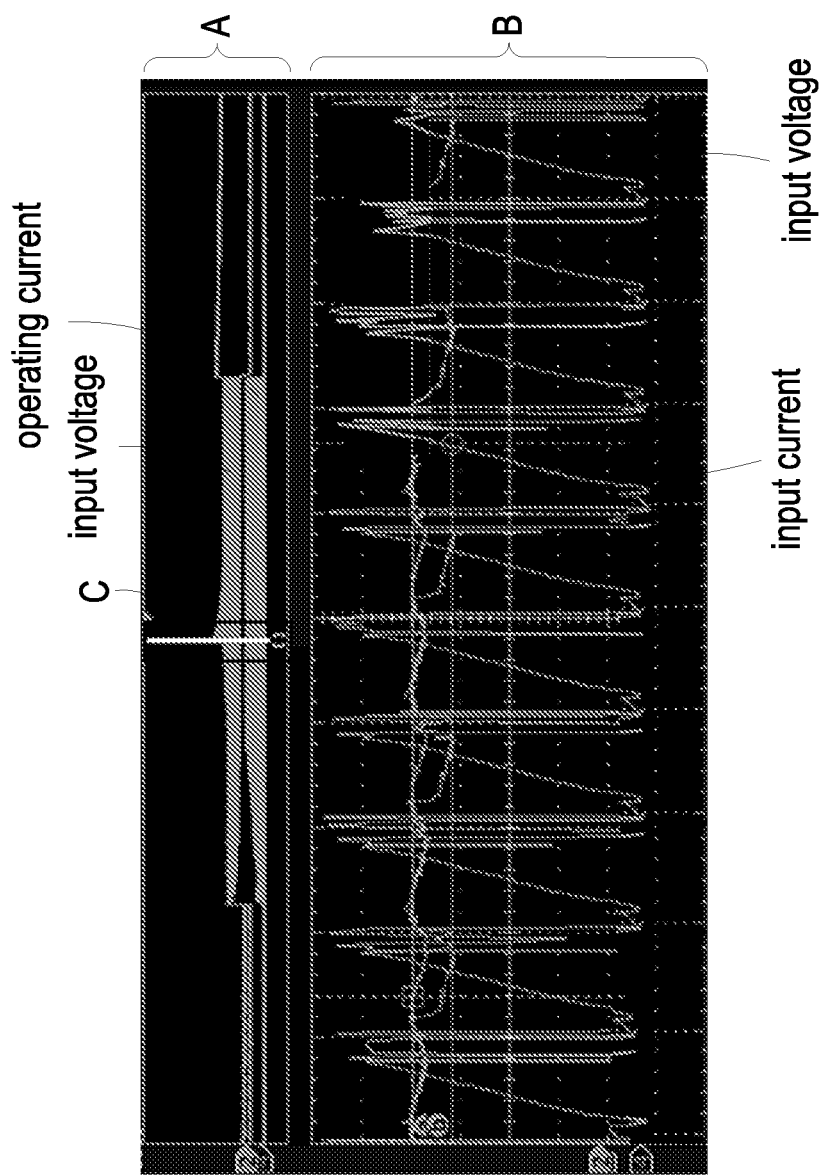
FIG. 3 is a simulation drawing illustrating the waveform of input voltage received by the power conversion device shown in FIG. 1 and an operating current of an electronic equipment.

Please refer to FIG. 2 and FIG. 3. FIG. 2 is a simulation drawing illustrating the waveform of input voltage received by a traditional power conversion device, which does not employ the voltage stabilizer shown in FIG. 1, and an operating current of an electronic equipment, and FIG. 3 is a simulation drawing illustrating the waveform of input voltage received by the power conversion device shown in FIG. 1 and an operating current of an electronic equipment. As shown in FIG. 2 and FIG. 3, region A shows the waveform as the impact from abnormal surge voltage occurs (which is indicated by frame C), and region B shows the partial amplified waveform of the impacted area as shown in region A. Because the traditional power conversion device does not employ the voltage stabilizer 4 as shown in FIG. 1, when the input voltage received by the traditional power conversion device rises to, e.g., higher than 60V, due to the unexpected abnormal surge voltage, the gate-source voltage of the first switching element Q1 of the switch circuit 5 may be higher than a withstanding value of 20V for a gate-source voltage of a general p-type MOSFET, so that the first switching element Q1 is damaged, and the electronic equipment is inoperable and the operating current of the electronic equipment is reduced to zero. On the contrary, the power conversion device 1 of the present disclosure includes the voltage stabilizer 4, and the bipolar junction transistor Q2 of the voltage stabilizer 4 is controlled to operate in the active region (also referred to as the amplification region). When the input voltage rises to, e.g., higher than 85V, due to the unexpected abnormal surge voltage, the gate-source voltage of the first switching element Q1 of the switch circuit 5 is only about 15.6 V (or lower, which is adjustable through designing of the first resistor R1 and the second resistor R2) which is lower than the withstanding value of the gate-source voltage of the general p-type MOSFET. Consequently, the first switching element Q1 will not be damaged, so that the electronic equipment is operated normally and the operating current of the electronic equipment is maintained at a normal value. Therefore, the power conversion device 1 of the present disclosure can improve the capability thereof to suppress abnormal surge voltage by means of the voltage stabilizer 4. Furthermore, in an emulation experiment, under a condition that the operation voltage of the electronic equipment is 24V, the operation voltage of the traditional power conversion device has a range of only about 14V to 34V. On the contrary, the operation voltage of the power conversion device 1 of the present disclosure reaches about 10V to 50V by means of the voltage stabilizer 4, and the increment is about 84%. In addition, under a condition that the operation voltage of the electronic equipment is 48V, the operation voltage of the traditional power conversion device has a range of only about 36V to 75V. On the contrary, the operation voltage of the power conversion device 1 of the present disclosure reaches about 20V to 85V, and the increment is about 54%.

Figure 4:
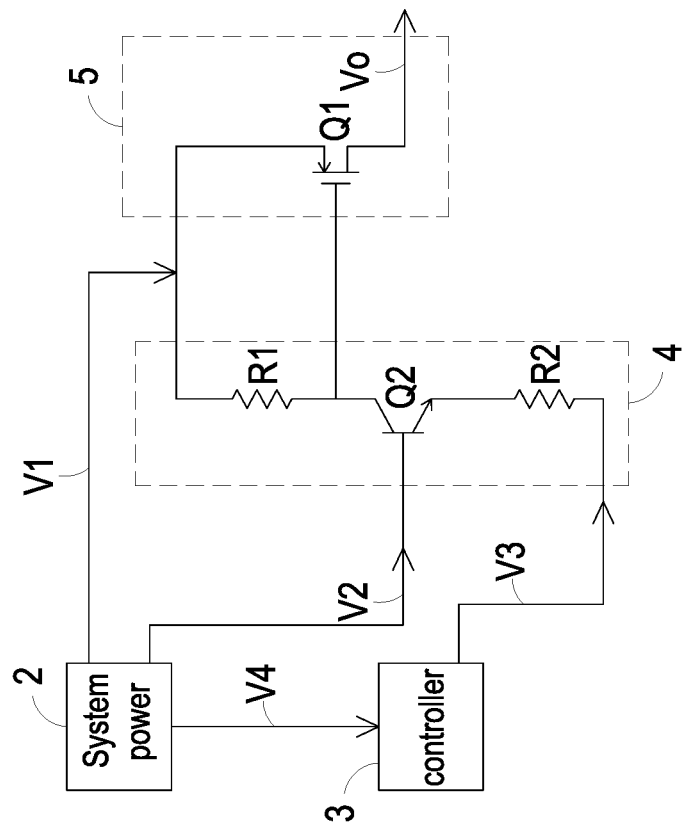
FIG. 4 is a schematic circuit diagram illustrating a power conversion device according to a second embodiment of the present disclosure.

Please refer to FIG. 4 which is a schematic circuit diagram illustrating a power conversion device according to a second embodiment of the present disclosure. In the embodiment, the circuit topology and the operation of the power conversion device 1B are similar to those of the power conversion device 1 in FIG. 1, and are not redundantly described hereinafter. Compared with the power conversion device 1 in FIG. 1, the base of the bipolar junction transistor Q2 in the power conversion device 1B of this embodiment is not electrically connected to the controller 3. Instead, the base of the bipolar junction transistor Q2 is electrically connected to the system power 2. Therefore, the second driving voltage V2 received by the bipolar junction transistor Q2 is no longer provided by the controller 3. The input voltage received by the power conversion device 1B is converted by the system power 2 to output the second driving voltage V2 to the base of the bipolar junction transistor Q2 so that the second driving voltage V2 is provided by the system power 2.

Figure 5:
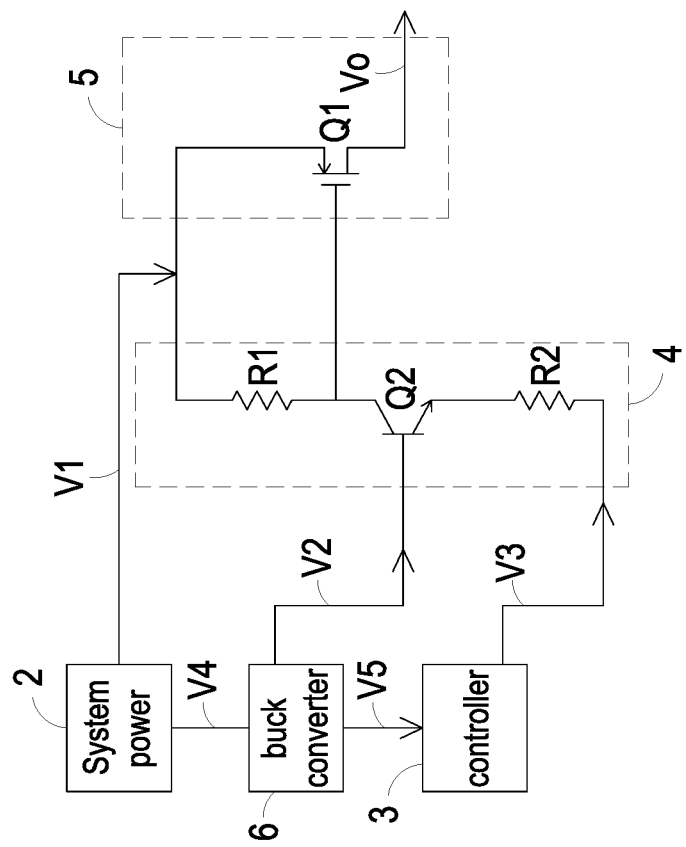
FIG. 5 a schematic circuit diagram illustrating a power conversion device according to a third embodiment of the present disclosure.

Please refer to FIG. 5 which is a schematic circuit diagram illustrating a power conversion device according to a third embodiment of the present disclosure. In the embodiment, the circuit topology and the operation of the power conversion device 1C are similar to those of the power conversion device 1 in FIG. 1, and are not redundantly described hereinafter. Compared with the power conversion device 1 in FIG. 1, the power conversion device 1C of this embodiment further includes a buck converter 6 electrically connected to the system power 2 and the controller 3 for converting the first control voltage V4 outputted by the system power 2 into a second control voltage V5 with lower voltage level, so as to provide the second control voltage V5 to the controller 3 for operating. Moreover, the base of the bipolar junction transistor Q2 in the power conversion device 1C is not electrically connected to the controller 3. Instead, the base of the bipolar junction transistor Q2 is electrically connected to the buck converter 6. Therefore, the second driving voltage V2 received by the bipolar junction transistor Q2 is no longer provided by the controller 3. Instead, the second driving voltage V2 is provided by the buck converter 6 to the bipolar junction transistor Q2.

Notably, the voltage stabilizer 4 mentioned above is not limited to be used in the power conversion device, but can be used for any applications, which need to protect the p-type MOSFET from being damaged due to the impact from the abnormal surge voltage. In addition, when the switch circuit 5 includes a plurality of p-type MOSFETs, the power conversion device includes a plurality of voltage stabilizers 4, and each of the plurality of voltage stabilizers is configured to stabilize the gate-source voltage of a corresponding p-type MOSFET.

From the above descriptions, the present disclosure provides a voltage stabilizer and a power conversion device using the same. The bipolar junction transistor of the voltage stabilizer is operated in the active region, so the emitter current of the bipolar junction transistor is stable. Under this circumstance, even the first driving voltage outputted by the system power rises due to the unexpected abnormal surge voltage and accordingly the gate voltage of the first switching element rises, the gate-source voltage of the first switching element still remains stable since the emitter current of the bipolar junction transistor is stable. Consequently, the first switching element of the p-type MOSFET is not easily damaged due to the impact from unexpected abnormal surge voltage, and the input voltage received by the power conversion device doesn't need to be reduced and the power conversion device can meet the current trend of wide voltage range requirements.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power conversion device, comprising:
   a system power configured to output a first driving voltage;
   a switch circuit comprising a first switching element, wherein a source of the first switching element is electrically connected to the system power for receiving the first driving voltage, and the switch circuit converts the first driving voltage into an output voltage; and
   a voltage stabilizer configured to stabilize a gate-source voltage of the first switching element and comprising:
   a transistor, wherein a base of the transistor receives a second driving voltage, and a collector of the transistor is electrically connected to a gate of the first switching element; and
   a first resistor, wherein a first terminal of the first resistor is electrically connected to the collector and the gate, and a second terminal of the first resistor is electrically connected to the system power and the source of the first switching element and receives the first driving voltage.

2. The power conversion device as claimed in claim 1, wherein the power conversion device comprises a controller electrically connected to the system power and driven by the system power.

3. The power conversion device as claimed in claim 2, wherein the transistor is a bipolar junction transistor, wherein the bipolar junction transistor is operated in an active region.

4. The power conversion device as claimed in claim 3, wherein the voltage stabilizer comprises a second resistor, wherein a first terminal of the second resistor is electrically connected to an emitter of the bipolar junction transistor, and a second terminal of the second resistor receives a third driving voltage.

5. The power conversion device as claimed in claim 4, wherein the controller is electrically connected to the second terminal of the second resistor, and the third driving voltage is outputted by the controller.

6. The power conversion device as claimed in claim 5, wherein the controller is electrically connected to the base of the bipolar junction transistor, and the second driving voltage is outputted by the controller.

7. The power conversion device as claimed in claim 5, wherein the base of the bipolar junction transistor is electrically connected to the system power, and the second driving voltage is outputted by the system power.

8. The power conversion device as claimed in claim 5, wherein the system power further outputs a first control voltage, and the system power comprises a buck converter electrically connected to the system power and the controller for converting the first control voltage into a second control voltage so as to drive the controller to operate, wherein the base of the bipolar junction transistor is electrically connected to the buck converter, and the second driving voltage is outputted by the buck converter.

9. The power conversion device as claimed in claim 3, wherein the bipolar junction transistor is an NPN bipolar junction transistor.

10. The power conversion device as claimed in claim 1, wherein the first switching element comprises a p-type MOSFET.

11. The power conversion device as claimed in claim 1, wherein the switch circuit further comprises a second switching element, and the first switching element and the second switching element are connected in series to form a switch bridge arm.

12. A voltage stabilizer for stabilizing a gate-source voltage of a first switching element, wherein a source of the first switching element receives a first driving voltage, the voltage stabilizer comprising:
    a transistor, wherein a base of the transistor receives a second driving voltage, and a collector of the transistor is electrically connected to a gate of the first switching element; and
    a first resistor, wherein a first terminal of the first resistor is electrically connected to the collector and the gate, and a second terminal of the first resistor is electrically connected to the source of the first switching element and receives the first driving voltage.

13. The voltage stabilizer as claimed in claim 12, wherein the transistor is a bipolar junction transistor, wherein the bipolar junction transistor is operated in an active region.

14. The voltage stabilizer as claimed in claim 13, wherein the voltage stabilizer comprises a second resistor, wherein a first terminal of the second resistor is electrically connected to an emitter of the bipolar junction transistor, and a second terminal of the second resistor receives a third driving voltage.

15. The voltage stabilizer as claimed in claim 13, wherein the bipolar junction transistor is an NPN bipolar junction transistor.

16. The voltage stabilizer as claimed in claim 12, wherein the first switching element comprises a p-type MOSFET.

17. A power conversion device, comprising:
    a system power configured to output a first driving voltage;
    a controller electrically connected to the system power and driven by the system power, and outputting a second driving voltage and a third driving voltage;
    a switch circuit comprising at least one switch bridge arm, wherein the at least one switch bridge arm comprises a MOSFET, and the switch circuit converts the first driving voltage into an output voltage; and
    at least one voltage stabilizer, wherein each of the at least one voltage stabilizer is configured to stabilize a gate-source voltage of a corresponding MOSFET and comprises:
    a transistor, wherein a base of the transistor is electrically connected to the controller for receiving the second driving voltage, and a collector of the transistor is electrically connected to a gate of the corresponding MOSFET; and a first resistor, wherein a first terminal of the first resistor is electrically connected to the collector and the gate of the corresponding MOSFET, and a second terminal of the first resistor is electrically connected to the system power and the source of the corresponding MOSFET and receives the first driving voltage.

\* \* \* \* \*